(12) United States Patent
Loewer et al.

(10) Patent No.: US 8,314,358 B2
(45) Date of Patent: Nov. 20, 2012

(54) THERMAL MATERIAL-PROCESSING METHOD

(75) Inventors: Thorsten Loewer, Munich (DE); Juergen Fath, Munich (DE)

(73) Assignee: Pro-Beam AG & Co. KGAA (DE)

( * ) Notice: Subject to any disclaimer, the term of this patent is extended or adjusted under 35 U.S.C. 154(b) by 214 days.

(21) Appl. No.: 12/910,226

(22) Filed: Oct. 22, 2010

(65) Prior Publication Data

US 2011/0095001 A1 Apr. 28, 2011

(30) Foreign Application Priority Data

Oct. 23, 2009 (DE) .......................... 10 2009 050 521

(51) Int. Cl.
*G01N 27/00* (2006.01)
*B23K 15/00* (2006.01)
*H01J 37/315* (2006.01)

(52) U.S. Cl. ........... 219/121.14; 219/121.13; 219/121.3; 250/397; 250/398

(58) Field of Classification Search ............. 219/121.13, 219/121.14, 121.28, 121.3, 121.31; 250/397, 250/398
See application file for complete search history.

(56) References Cited

U.S. PATENT DOCUMENTS

| 3,426,174 | A | * | 2/1969 | Graham et al. .......... 219/121.12 |
| 3,597,607 | A | * | 8/1971 | Campbell et al. ............. 250/307 |
| 3,743,776 | A | * | 7/1973 | Corcelle et al. .......... 219/121.13 |
| 4,794,259 | A | | 12/1988 | Sanderson et al. |
| 6,977,382 | B2 | * | 12/2005 | Lower ........................... 250/397 |

FOREIGN PATENT DOCUMENTS

| DE | 1 615 507 B | 5/1970 |
| DE | 30 43 635 C1 | 5/1987 |
| EP | 0 242 993 A1 | 10/1987 |
| EP | 0 309 930 A1 | 4/1989 |
| JP | 55-16791 A1 | 2/1980 |
| US | 62-238084 A1 | 10/1987 |

* cited by examiner

*Primary Examiner* — Samuel M Heinrich
(74) *Attorney, Agent, or Firm* — Factor Intellectual Property Law Group, Ltd.

(57) ABSTRACT

A thermal material-processing method wherein between the working spot of an electron beam and a workpiece a relative motion is brought about. Prior to the actual thermal treatment an effective processing contour is ascertained, in that the working spot of the electron beam executes, in accordance with the stored data of an ideal processing contour, a relative motion in relation to the workpiece, and on this relative motion a scan motion is superimposed which is directed transversely to the ideal processing contour. In this manner, both geometrical and magnetically conditioned deviations of the points of incidence of the electron beam on the workpiece can be compensated.

20 Claims, 5 Drawing Sheets

THERMAL MATERIAL-PROCESSING METHOD

RELATED APPLICATIONS

This application claims the filing benefit of German Patent Application No. 10 2009 050 521.0 filed Oct. 23, 2009 the contents of which are incorporated herein by reference.

TECHNICAL FIELD

The invention relates to a material-processing method wherein
a) an electron beam is focused onto the surface of a workpiece:
b) between the working spot of the electron beam and the workpiece a relative motion is brought about, in the course of which the working spot follows a processing contour;
c) the relative motion between working spot and workpiece is controlled in accordance with control variables that a control device derives from a stored ideal processing contour.

BACKGROUND OF THE INVENTION

The quality of a thermal processing brought about with the aid of an electron beam—for example, a weld—depends to a great extent on how accurately the working spot of the electron beam strikes the desired processing contour—in the case of the welding of two structural components, the groove path between the structural components to be welded—in the course of its relative motion in relation to the workpiece. In known material-processing methods of the type specified in the introduction, inaccuracies in this respect occur for differing reasons. A first reason consists in geometrical deviations between the actual processing contour and the expected processing contour stored in the control device, which in the following is also called the 'ideal' processing contour.

The geometrical deviations, in turn, may be both the cause of an inaccurate clamping of the workpiece and also the consequence of tolerance deviations to which the workpiece is subject in the course of manufacture. The consequence of these geometrical deviations is that although the working spot of the electron beam follows the ideal processing contour correctly, it does not strike the real processing contour or does not strike it everywhere. A second cause of deviations between the working spot of the electron beam and the actual processing contour may consist in the fact that a residual magnetisation is present in the workpiece, under the influence of which the electron beam is deflected. This has the consequence that the working spot of the electron beam does not strike the actual processing contour, even when the latter follows the stored ideal processing contour. These magnetically conditioned deviations therefore result in a behaviour that—judging from the outcome at any rate—is tantamount to a geometrical deviation of the actual processing contour from the ideal processing contour. A further cause of the working spot not striking the actual processing contour, or not striking it everywhere, may consist in errors in the programming of the motion.

In order to ensure that the working spot of the electron beam impinges everywhere on the actual processing contour, said working spot would have to be controlled in accordance with control variables that corresponds to a processing contour possibly deviating both from the ideal processing contour and from the actual processing contour, which here is called the 'effective' processing contour. If a magnetic deflection of the electron beam is eliminated, the effective processing contour corresponds to the actual processing contour.

The present invention is directed to resolving these and other matters.

SUMMARY OF THE INVENTION

An object of the present invention is to configure an electron-beam material-processing method of the type stated in the introduction in such a way that the deviation of the effective processing contour from the ideal processing contour is presented in readily comprehensible manner and in this way there is also the possibility of simple correction of this deviation.

In accordance with the invention, this object may be achieved in that
d) prior to the actual welding operation a determination of the effective processing contour is undertaken, in that
da) the working spot of the electron beam executes a relative motion in relation to the workpiece in accordance with the stored data of the ideal processing contour with operating parameters that do not suffice for thermal treatment;
db) on this relative motion corresponding to the ideal processing contour there is superimposed at a plurality of points a scan motion which is directed transversely to the ideal processing contour and reaches beyond the latter on both sides;
dc) the intensity of the electron beam back-scattered from the workpiece is measured as a function of the deflection of the scan motion;
dd) the intensity dependences ascertained in step dc, which were measured in the course of the various scan motions, are placed side by side in such a way that a graphical representation of the workpiece arises in which the progress of the relative motion in the direction of the processing contour is plotted on one axis and the deviation of the effective processing contour from the ideal processing contour is plotted in a second axis.

When 'operating parameters' are mentioned above under da), in particular the energy density in the working spot of the electron beam and/or the velocity of the relative motion between the working spot and the workpiece are/is meant thereby.

The term 'control variables' in the sense of feature c) stated in the introduction is understood to mean all parameters that the control device generates for the purpose of inducing a certain relative motion between the focus of the electron beam and the workpiece. In this connection it is a question, in particular, of the magnitude and the temporal progression of control currents and/or control voltages that are used for deflecting the electron beam and/or for the mechanical motion of electron beam and/or workpiece.

With the method according to the invention a kind of 'unwinding' of the processing contour is generated in such a manner that irrespective of the actual, generally curved, path of the processing contour the ideal processing contour is always represented as a straight line, and the deviation of the effective processing contour from the ideal processing contour is always represented as a deviation from the straight-line shape. This is readily comprehensible, in particular also for unskilled or only semi-skilled operators, and, in addition, represents a shape that is particularly well-suited for a subsequent correction of the deviations.

In accordance with the invention the effective processing contour, which takes account of both geometrically and magnetically conditioned deviations of the 'incidence track' of the electron beam from the ideal processing contour on the workpiece, is ascertained in the same device that also implements the actual material-processing method. This signifies multiple advantages in comparison with a photo-optical method for determining the actual processing contour. On the one hand, the expenditure on equipment is very much lower, since in general all the requisite components are present anyway in the electron-beam equipment. But, furthermore, the method according to the invention is also superior to a photo-optical method for the reason that the electron beam employed for determining the effective processing contour 'sees' the processing contour just as the electron beam also does in the course of the subsequent actual processing of material, so that, in particular, magnetic deflections that cannot be detected by photo-optical means are also given consideration.

The method according to the invention is particularly well-suited for the welding of two structural components, wherein the processing contour is accordingly a groove between two structural components to be joined to one another so as to form a workpiece.

It is particularly easy to add to the detection of the deviations of the effective processing contour from the ideal processing contour a correction step with which the deviations for the thermal treatment are corrected. Said correction step is distinguished in that, after step d), e) the control variables corresponding to the ascertained effective processing contour are set in such a way that in the course of the progress of the relative motion in the direction of the effective processing contour the working spot of the electron beam lies everywhere on said contour;

f) the relative motion between the working spot of the electron beam and the workpiece is then implemented again with operating parameters that are suitable for thermal treatment.

The setting of the control variables in accordance with step e) can in many cases be undertaken empirically, since after brief experience with the system the type of the requisite correction of the control variables can be inferred from the shape of the ascertained effective processing contour. In each case, after each correction of the control variables it is readily possible to recognise whether or not the (new) effective processing contour has approximated to the desired shape of a straight line. In the case of certain characteristic deviations, algorithms can also be developed with which the deviations can be reduced to a tolerable extent.

The relative motion between the working spot of the electron beam and the workpiece may be effected mechanically by motion of the workpiece and/or of the electron-beam source together with imaging elements. A not inconsiderable expenditure on equipment is required for this; the motion is comparatively sluggish.

Alternatively or additionally, the relative motion between the working spot of the electron beam and the workpiece may be effected electrically by deflecting the electron beam. This is possible with comparatively little expenditure on equipment and without inertia, but is understandably subject to geometrical limits. In each case it is expedient to implement at least the scan motion electrically by appropriate deflection of the electron beam.

When it was stated above that the direction of the scan motion is to be transverse to the direction of the ideal processing contour, this does not inevitably mean a right angle. In many cases, although for reasons of evaluation it will be expedient if the direction of the scan motion is perpendicular to the tangent to the corresponding point of the ideal processing contour, in principle arbitrary other angles also enter into consideration.

It may happen that in the course of the clamping of the workpiece a relatively coarse incorrect positioning is effected. In this case a procedure may prove useful in which prior to the determination of the effective processing contour with the aid of the back-scattered electron beam an image of the workpiece is generated and thereby information is obtained about the position thereof in a system-specific coordinate system, and in which deviations of this position from a specified position are then compensated mechanically or electronically. In principle it would in fact be possible to manage without this 'pre-positioning' if only the amplitude of the scan motion were sufficiently large. But in general this amplitude is limited, for constructional reasons, so that prior to the ascertainment of the effective processing contour the 'coarse position' of the workpiece has to be 'straightened out'.

It is to be understood that the aspects and objects of the present invention described above may be combinable and that other advantages and aspects of the present invention will become apparent upon reading the following description of the drawings and detailed description of the invention.

DETAILED DESCRIPTION OF THE PRESENT INVENTION

Figure 1:
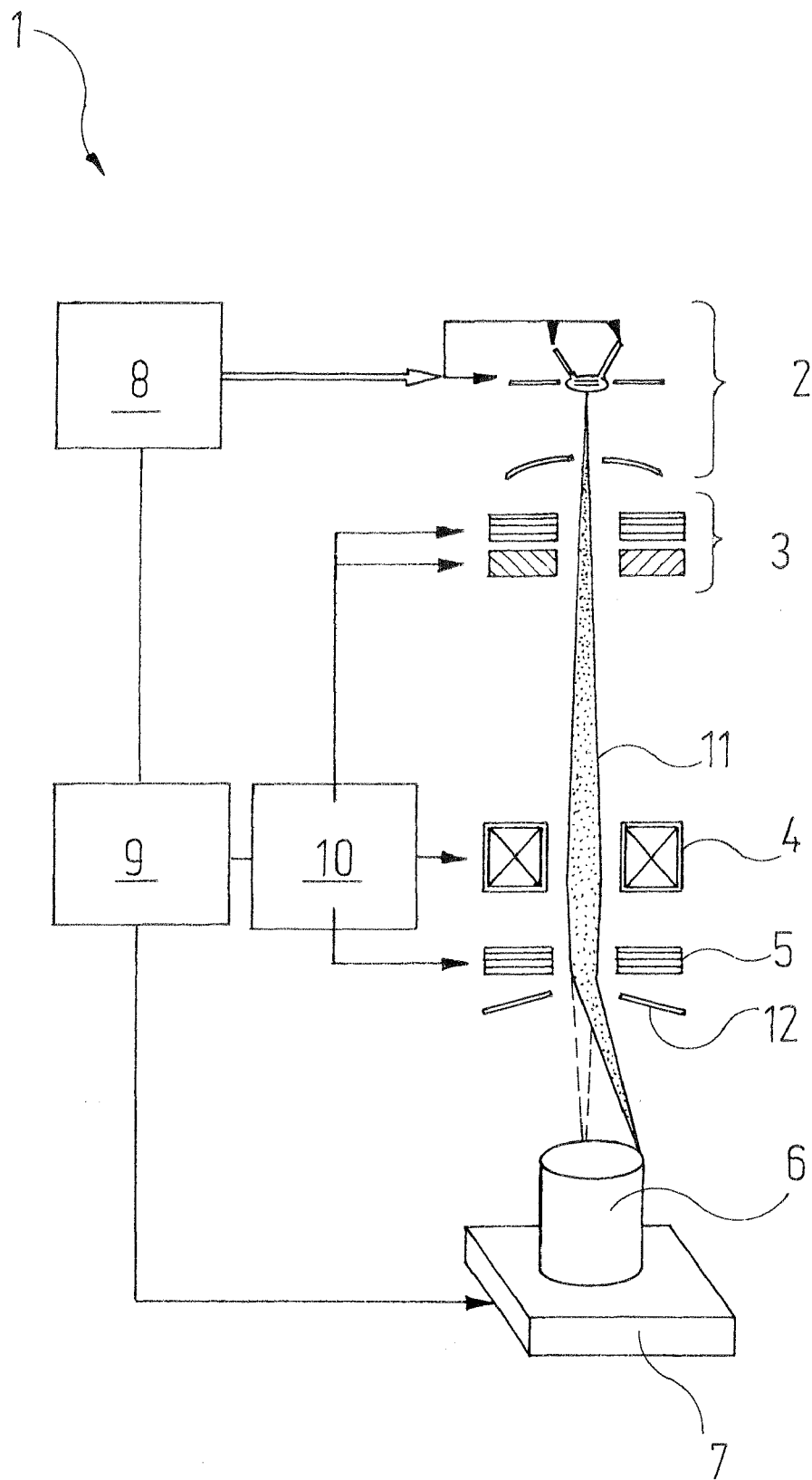
FIG. 1 is a schematic drawing for a unit for electron-beam welding.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

Reference will firstly be made to FIG. 1. This shows a unit for electron-beam welding, labelled overall by reference symbol 1, as is known as such. It will therefore be sufficient to describe it briefly.

The unit 1 comprises, in a vacuum-tight housing which is not represented, from top to bottom an electron-beam source 2, a centering and stigmator unit 3 including various deflecting electrodes, a focusing lens 4 comprising suitable coils, and also x-y deflection coils 5. The workpiece 6 stands on a manipulator 7 with which it can be moved in the x-y plane by means of a motor and with high precision.

In a control device 9, output signals for various amplifiers 10 are generated in addition which, in turn, again apply suitable currents and voltages to the centering and stigmator unit 3, to the focusing lens 4, to the deflection coils 5 and also to the manipulator 7.

With the various aforementioned currents or voltages the electron beam 11 can be focused onto the workpiece 6, and its working spot which has arisen in this way can be moved on the workpiece 6.

Below the deflecting electrodes 5 there are arranged sensor plates 12 which are capable of detecting the electrons backscattered from the workpiece 6. With the aid of the sensor plates 12 an image of the workpiece 6 can, for example, be generated that is quite similar to an optical image, as is known in the state of the art.

Figure 2:
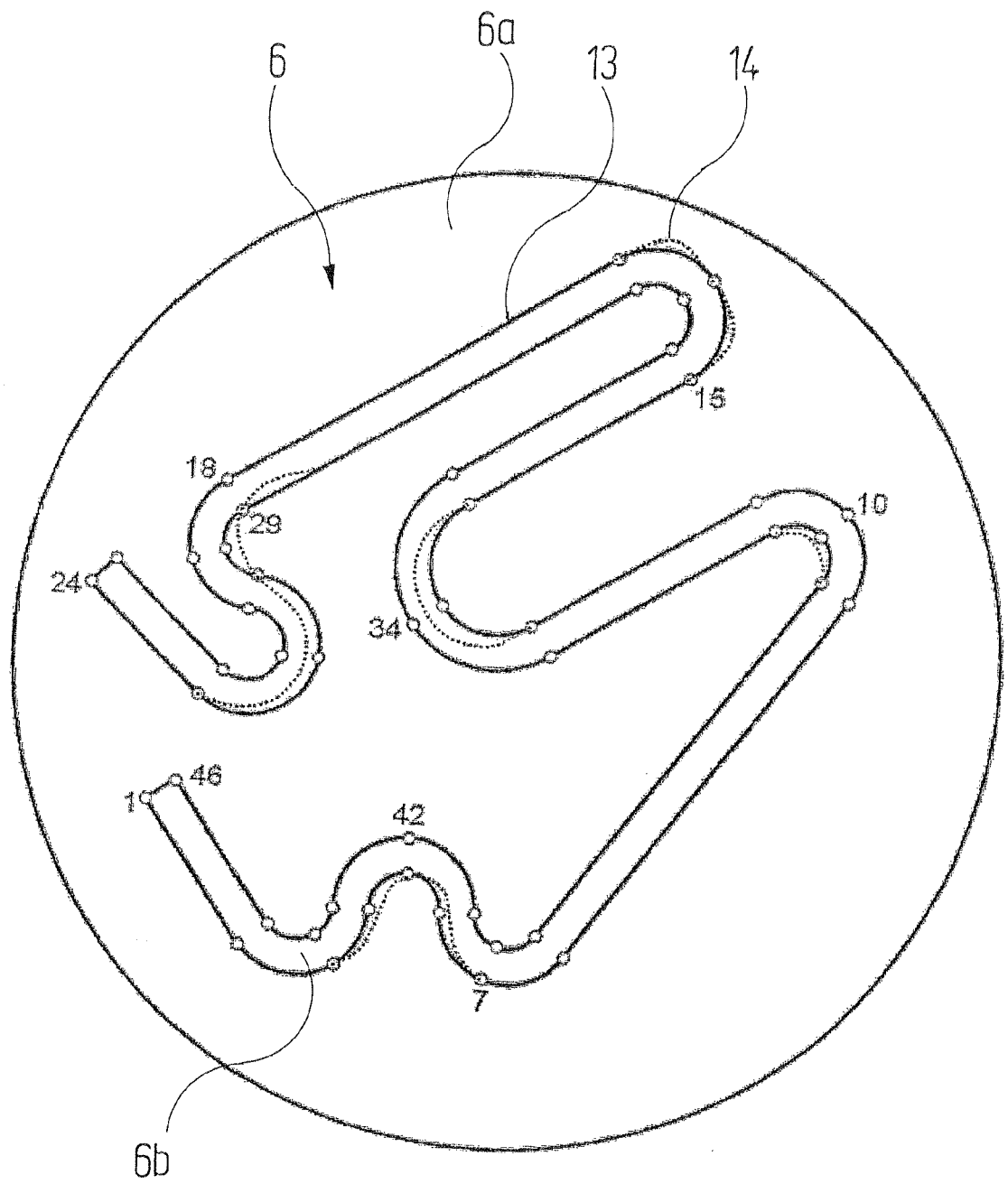
FIG. 2 is a top view of a workpiece which comprises two structural components to be welded together.

By using the unit 1 elucidated above with reference to FIG. 1, the welding method according to the invention can now be implemented as described in the following. The description is given on the basis of an exemplary workpiece 6 which is represented in FIG. 2 and which comprises two structural components 6a and 6b to be welded together. Situated between the two structural components 6a, 6b is the ideal welding groove 13 which, in the case of welding, constitutes the processing contour and which is saved in the control device 9 of the unit 1. However, by reason of errors such as were outlined above and such as will be elucidated once again more precisely further below, the working spot of the electron beam 11 does not follow the ideal groove path 13 but rather follows an effective groove path 14 which deviates from the ideal groove path 13 in the regions represented in dotted manner.

Along the ideal groove path 13 various reference points 1 to 46 are indicated which serve for description purposes.

First of all, from the electron beam 11 back-scattered on the workpiece 6 an image or partial image of the workpiece 6 is generated which enables a determination of the coarse position of the workpiece 6 in the system-specific coordinate system of the unit 1. If this position differs considerably from a stored specified position, the workpiece 6 is pushed closer to the specified position with the aid of the manipulator 7.

Figure 3:
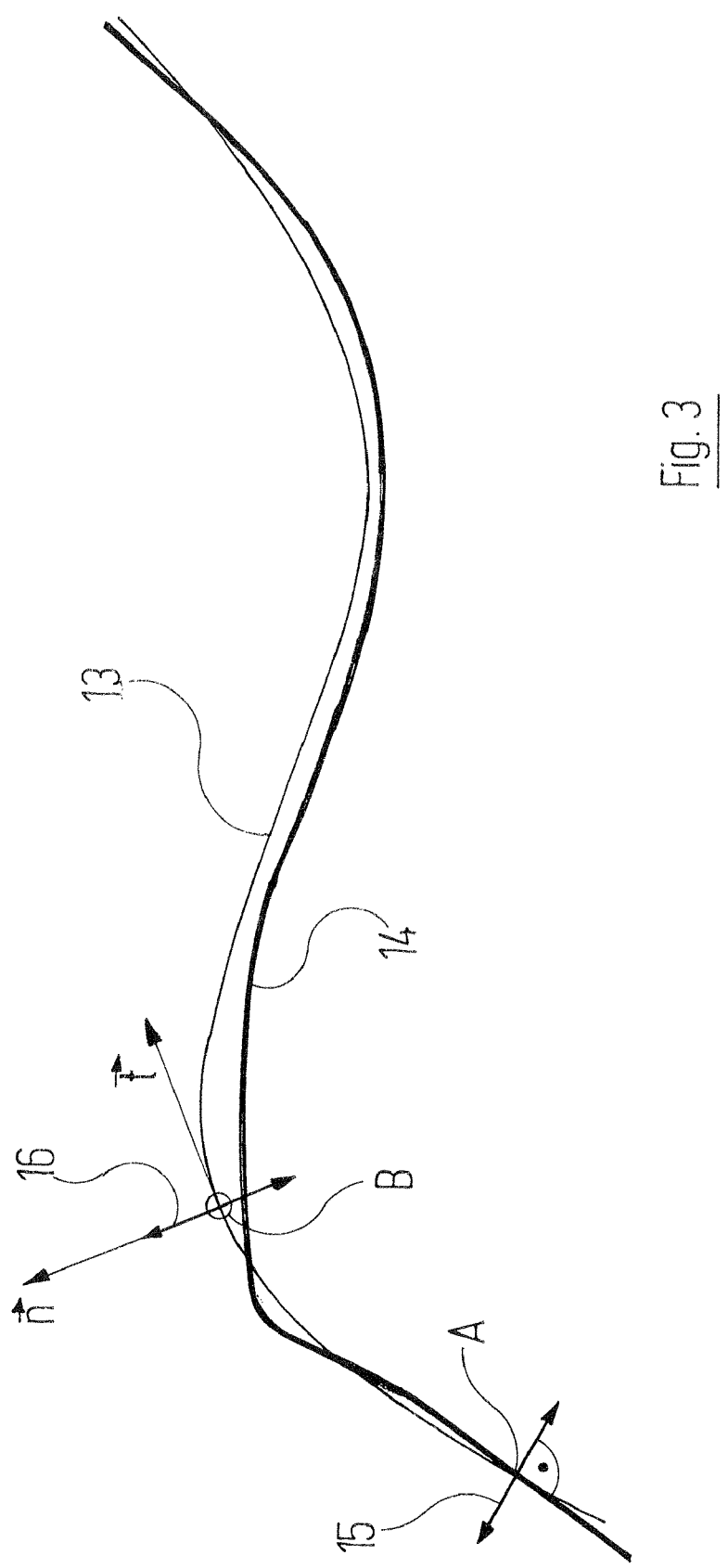
FIG. 3 is a schematic drawing of the scan operation that precedes the actual electron-beam welding.

Now the actual welding is prepared in the following manner:

In FIG. 3 a section of the ideal groove path between the two structural components 6a, 6b to be welded together is represented by the relatively thin line 13, which, as already mentioned above, is programmed within the control device 9 in suitable manner. By the somewhat thicker line 14 the corresponding section of the 'effective' groove path is represented which by reason of various influences deviates from the ideal groove path 13. Very frequently, deviations of such a type are based on genuine geometrical deviations of the real groove path, which, in turn, may lie their cause in a faulty clamping of the workpiece 6 on the manipulator 7, or in manufacturing tolerances of the structural components 6a, 6b to be welded together. The deviation of the effective groove path 14 from the ideal groove path 13 may, however, also have non-geometrical reasons, namely when in the case of magnetic structural components 6a, 6b the electron beam 11 is deflected by an existing residual magnetism in such a way that the ideal groove 13 is not correctly struck by the electron beam 11.

For the purpose of ascertaining the effective groove path 14, in a scan operation placed ahead of the actual welding operation the procedure is as follows:

The working spot of the electron beam 11 is moved, with diminished energy density and/or at higher speed, which does not suffice for welding, along the ideal groove path 13, whereby on this feed motion there is superimposed a scan motion 15 and 16, respectively, running perpendicular to the respective tangential direction of the ideal groove path 13. This scan motion 15 and 16, respectively, extends on both sides beyond the 'ideal' groove path 13 by an amplitude a (cf. FIGS. 3 and 4). During the feed motion and the scan motion 15 and 16, respectively, of the electron beam 11 an intensity signal is recorded with the aid of the sensor plates 12 of the unit 1. In the process, certain intensity fluctuations, such as are represented in FIGS. 4 and 5, arise as a function of the deflection of the working spot from the ideal groove path 13.

First of all, in FIG. 3 let point A of the ideal groove path 13 be considered, at which the ideal groove path 13 coincides with the effective groove path 14. In this case the progression of the intensity of the back-scattered electron beam 11, ascertained with the aid of the sensor plates 12, looks as represented in FIG. 4. A pronounced minimum is situated at the 'zero' point—that is to say, at the point at which the scan motion 15 of the electron beam 11 just crosses the 'ideal' groove path 13.

On the other hand, the situation is different at point B in FIG. 3, at which the ideal groove path 13 clearly deviates from the effective groove path 14. The intensity signal obtained at this point with the aid of the sensor plates 12 is represented in FIG. 5. Also in this case a clear minimum of the intensity arises, which, however, is located laterally alongside that point at which the working spot of the electron beam 11 runs over the ideal groove path 13.

Figure 4:
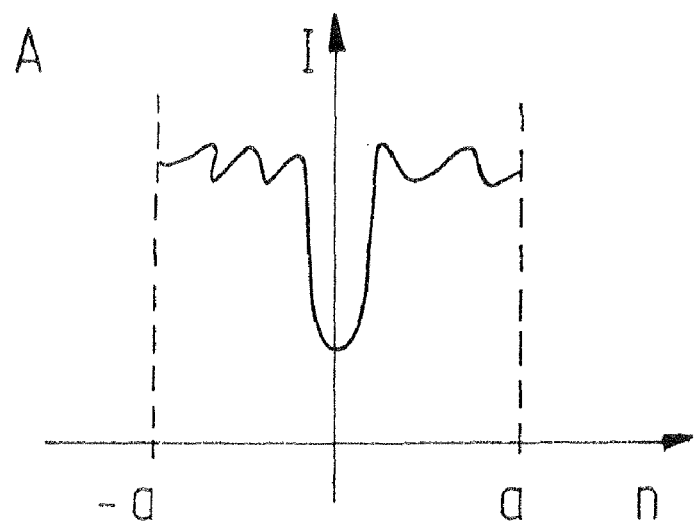
FIG. 4 is a graphical representation of a signal obtained in the course of the scan operation at a point at which the gauged, effective groove coincides with the programmed, ideal groove path.
Figure 5:
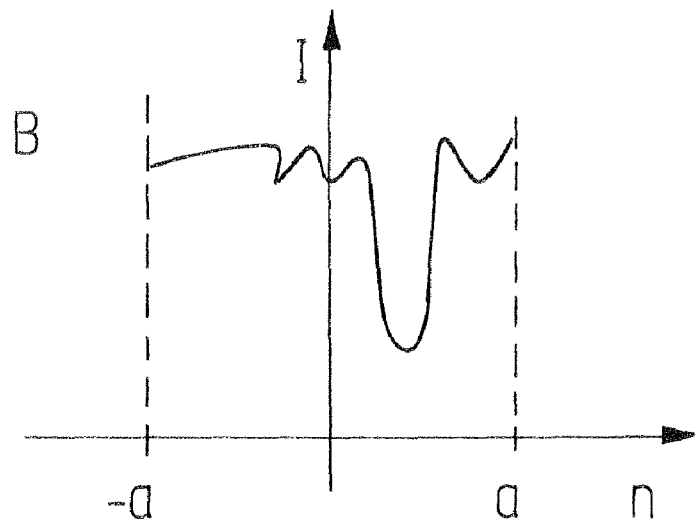
FIG. 5 is a graphical representation of a signal obtained in the course of the scan operation at a point at which the gauged, effective groove deviates from the programmed, ideal groove path.
Figure 6:
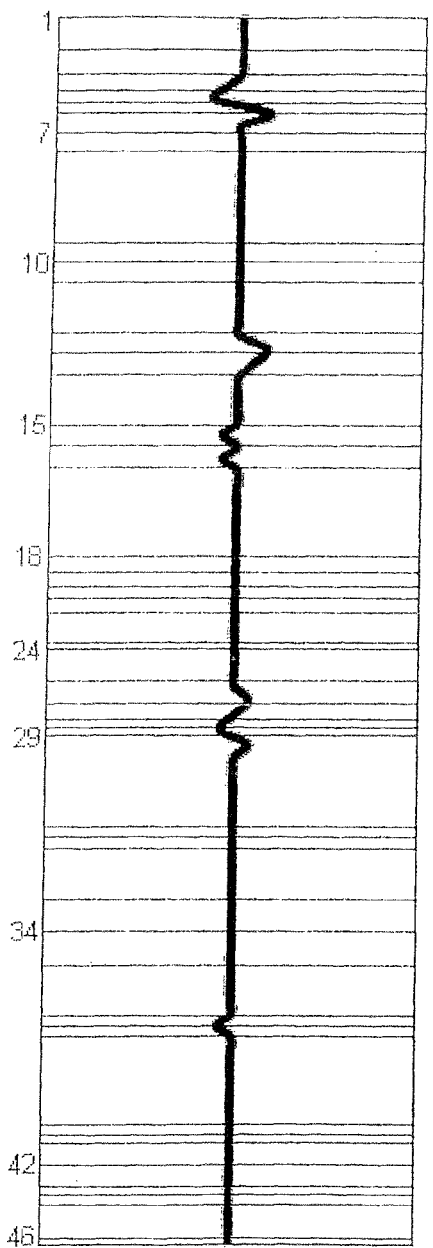
FIG. 6 is a schematic drawing of the 'unwound' effective groove path prior to a correction of the deviations from the ideal groove path.

For the purpose of readily comprehensible representation of the effective groove path 14, use is not made of the intensity curves as shown in FIGS. 4 and 5. Rather, a representation is chosen that corresponds to an image of the workpiece 6 in the neighborhood of the ideal groove path 13. For this purpose, for example, the intensity progressions according to FIGS. 4 and 5 are converted into tonal values. The tonal values obtained in the course of the various scan motions are put together in a manner as represented in FIG. 6. This Figure shows, in particular, the tonal-value distributions at the 46 reference points of FIG. 2. The location of the effective groove path 14 is recognisable by means of a wide dark line.

Figure 7:
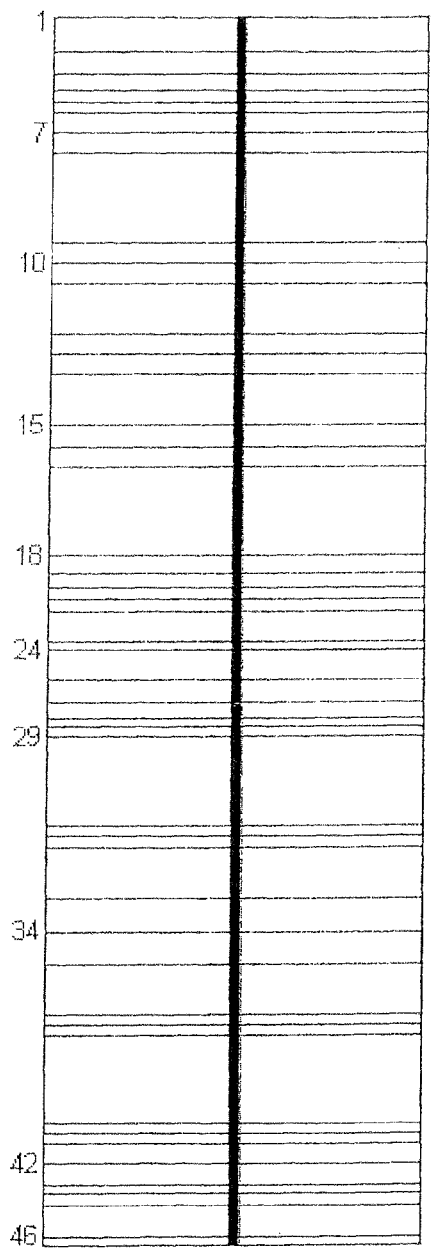
FIG. 7 is a schematic drawing of the 'unwound' effective groove path after the correction.

By reason of the manner of proceeding described above on the basis of FIG. 3, in the course of the scan operation a kind of unwinding of the effective groove path 14 results. If the latter coincides everywhere with the ideal groove path 13, a straight line always results—that is to say, irrespective of the geometrical guidance of the ideal groove path 13 on the workpiece 6—by way of image, as shown in FIG. 7. Deviations of the effective groove path 14 from the ideal groove path 13 are manifested in corresponding deviations of the image from the straight-line shape, as shown in FIG. 6.

It is obvious that the images obtained as a result of the scan operation permit a very rapid evaluation which is easy to understand, precisely also for the reason that the basic shape of the ideal groove path 13 in the image—irrespective of the actual geometrical groove path on the workpiece 6—is always a straight line, and a deviation of the effective groove path 14 from the ideal groove path 13 in the image is always a deviation from the straight-line shape.

This 'standardisation' of the graphical representation of the 'unwound' effective groove path 14 also facilitates the correction of the control variables of the control device 9 in such a manner that the deviations of the effective groove path 14 from the ideal groove path 13 are reduced. Here, empirical findings frequently suffice in order to be able to implement successful amendments of the control variables. A further scan operation implemented after such an amendment makes it immediately clear whether the corrections of the control variables that were undertaken went in the right direction or not—that is to say, whether or not the graphical representation of the effective groove path 14 has approximated better to the straight-line shape.

In many cases it is also possible to assign to certain shapes of the deviations of the effective groove path 14 from the ideal groove path 13 an algorithm with which the new control variables can be calculated that are suitable for a correction of the guidance of the electron beam 11.

Once the scan operation that has been described has been concluded and the new control variables that are suitable for the correction have been set in the control device 9, the electron beam 11 can now be guided without difficulty along the effective groove path 14 with sufficient energy density in the working spot and/or at correspondingly lower speed for the actual welding operation, so that the structural components 6a, 6b situated on both sides of the effective groove path 14 can be joined together in highly precise manner.

Instead of being effected electronically, the relative motion between working spot of the electron beam 11 and the workpiece 6 may be effected by deflection of the electron beam also by mechanical motion of the workpiece 6 on the manipulator 7 or also by mechanical motion of the electron-beam source 2 with the associated imaging elements 3, 4, 5, 12.

As already mentioned above, the welding of two structural components is only one example of a thermal material-processing method. The manner of proceeding in other methods is, however, fundamentally the same, in which connection in the above description the more general term 'processing contour' then takes the place of the more specific term 'groove path'.

The above description of the invention was given on the basis of an example in which deviations of the effective processing contour from the ideal processing contour were present in one direction only. However, the method according to the invention is also suitable for cases in which deviations of the effective processing contour from the ideal processing contour are present also in a further direction. Deviations of such a type are manifested in local blurred regions of the image according to FIG. 6 or 7. The correction in this direction is effected in such a way that these images become sharp over their entire extent.

What is claimed is:

1. A method for thermal material-processing comprising the steps of:
   a) focusing an electron beam having a working spot onto a surface of a workpiece;
   b) bringing about a relative motion between the working spot of the electron beam and the workpiece wherein the working spot follows a processing contour;
   c) controlling the relative motion between working spot and workpiece in accordance with control variables that a control device derives from a stored ideal processing contour;
   d) prior to a welding operation determining an effective processing contour by:
      da) executing a relative motion of the working spot in relation to the workpiece in accordance with a stored data of an ideal processing contour with operating parameters that do not suffice for thermal treatment;
      db) superimposing a plurality of points of a scan motion which is directed transversely to the ideal processing contour and reaches beyond the latter on both sides;
      dc) measuring an intensity of the electron beam that is back-scattered from the workpiece as a function of a deflection of the scan motion;
      dd) placing the intensity ascertained in step dc) side by side in such a way that a graphical representation of the workpiece arises in which a progress of the relative motion in the direction of the ideal processing contour is plotted on one axis and a deviation of the effective processing contour from the ideal processing contour is plotted in a second axis.

2. The method according to claim 1, wherein the ideal processing contour and the effective processing contour are grooves between two structural components to be joined together so as to form the workpiece.

3. The method according to claim 1, wherein after step dd):
   e) the control variables corresponding to the ascertained effective processing contour are set in such a way that in the course of the relative motion in the direction of the effective processing contour the working spot of the electron beam lies everywhere on said contour; and,
   f) the relative motion between the working spot of the electron beam and the workpiece is then implemented again with operating parameters that are suitable for thermal treatment.

4. The method according to claim 1 wherein the relative motion between the working spot of the electron beam and the workpiece is effected mechanically by a motion of the workpiece and/or of an electron-beam source together with imaging elements.

5. The method according to claim 1 wherein the relative motion between the working spot of the electron beam and the workpiece is effected electrically by deflecting the electron beam.

6. The method according to claim 1, wherein a direction of the scan motion is perpendicular to a tangent of a corresponding point of the ideal processing contour.

7. The method according to claim 1, wherein prior to the determination of the effective processing contour an image of the workpiece is generated and thereby information is obtained about a position thereof in a system-specific coordinate system, and in that deviations of the position from a specified position are then compensated mechanically or electrically and wherein the image is generated with the aid of the electron beam that is back-scattered.

8. The method according to claim 2, wherein after step dd):
   e) the control variables corresponding to the ascertained effective processing contour are set in such a way that in the course of the relative motion in the direction of the effective processing contour the working spot of the electron beam lies everywhere on said contour; and,
   f) the relative motion between the working spot of the electron beam and the workpiece is then implemented again with operating parameters that are suitable for thermal treatment.

9. The method according to claim 2 wherein the relative motion between the working spot of the electron beam and the workpiece is effected mechanically by a motion of the workpiece and/or of an electron-beam source together with imaging elements.

10. The method according to claim 3 wherein the relative motion between the working spot of the electron beam and the workpiece is effected mechanically by a motion of the workpiece and/or of an electron-beam source together with imaging elements.

11. The method according to claim 2 wherein the relative motion between the working spot of the electron beam and the workpiece is effected electrically by deflecting the electron beam.

12. The method according to claim 3 wherein the relative motion between the working spot of the electron beam and the workpiece is effected electrically by deflecting the electron beam.

13. The method according to claim 2, wherein a direction of the scan motion is perpendicular to a tangent of a corresponding point of the ideal processing contour.

14. The method according to claim 3, wherein a direction of the scan motion is perpendicular to a tangent of a corresponding point of the ideal processing contour.

15. The method according to claim 4, wherein a direction of the scan motion is perpendicular to a tangent of a corresponding point of the ideal processing contour.

16. The method according to claim 5, wherein a direction of the scan motion is perpendicular to a tangent of a corresponding point of the ideal processing contour.

17. The method according to claim 2, wherein prior to the determination of the effective processing contour an image of the workpiece is generated and thereby information is obtained about a position thereof in a system-specific coordinate system, and in that deviations of the position from a specified position are then compensated mechanically or electrically and wherein the image is generated with the aid of the electron beam that is back-scattered.

18. The method according to claim 3, wherein prior to the determination of the effective processing contour an image of the workpiece is generated and thereby information is obtained about a position thereof in a system-specific coordinate system, and in that deviations of the position from a specified position are then compensated mechanically or electrically and wherein the image is generated with the aid of the electron beam that is back-scattered.

19. The method according to claim 4, wherein prior to the determination of the effective processing contour an image of the workpiece is generated and thereby information is obtained about a position thereof in a system-specific coordinate system, and in that deviations of the position from a specified position are then compensated mechanically or electrically and wherein the image is generated with the aid of the electron beam that is back-scattered.

20. The method according to claim 5, wherein prior to the determination of the effective processing contour an image of the workpiece is generated and thereby information is obtained about a position thereof in a system-specific coordinate system, and in that deviations of the position from a specified position are then compensated mechanically or electrically and wherein the image is generated with the aid of the electron beam that is back-scattered.

* * * * *